(12) United States Patent
Uematsu et al.

(10) Patent No.: US 7,986,037 B2
(45) Date of Patent: Jul. 26, 2011

(54) LOW NOISE SEMICONDUCTOR DEVICE

(75) Inventors: Yutaka Uematsu, Hachioji (JP);
Tatsuya Saito, Kunitachi (JP); Hideki Osaka, Oiso (JP); Yoji Nishio, Tokyo (JP); Shunichi Saito, Tokyo (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 406 days.

(21) Appl. No.: 12/068,606

(22) Filed: Feb. 8, 2008

(65) Prior Publication Data
US 2008/0290495 A1 Nov. 27, 2008

(30) Foreign Application Priority Data

Mar. 15, 2007 (JP) ................................. 2007-066900

(51) Int. Cl.
*H01L 23/52* (2006.01)
(52) U.S. Cl. ................. 257/691; 257/532; 257/E23.153
(58) Field of Classification Search .................. 174/261; 257/724, E23.153, E29.001, 532, 691
See application file for complete search history.

(56) References Cited

U.S. PATENT DOCUMENTS

| 6,873,219 | B2 | 3/2005 | Grebenkemper | |
|---|---|---|---|---|
| 2001/0050182 | A1* | 12/2001 | Takeshita et al. | 174/261 |
| 2007/0085200 | A1* | 4/2007 | Lu et al. | 257/724 |
| 2007/0145559 | A1 | 6/2007 | Uematsu et al. | |
| 2008/0258259 | A1* | 10/2008 | Osaka et al. | 257/532 |

FOREIGN PATENT DOCUMENTS

| JP | 11-97810 | 9/1997 |
|---|---|---|
| JP | 2001-244582 | 2/2000 |
| JP | 2006-32823 | 7/2004 |

* cited by examiner

*Primary Examiner* — Matthew E Warren
*Assistant Examiner* — Fang-Xing Jiang
(74) *Attorney, Agent, or Firm* — Stites & Harbison PLLC; Juan Carlos A. Marquez, Esq.

(57) ABSTRACT

As a power feed route in a semiconductor chip, a power feed route which reduces antiresonance impedance in the frequency range of tens of MHz is to be realized thereby to suppress power noise in a semiconductor device. By inserting structures which raise the resistance in the medium frequency band into parts where the resistance is intrinsically high, such as power wiring in a semiconductor package and capacitor interconnecting electrode parts, the antiresonance impedance in the medium frequency band can be effectively reduced while keeping the impedance low at the low frequency.

4 Claims, 10 Drawing Sheets

TOP VIEW

SECTIONAL VIEW

TOP VIEW

SECTIONAL VIEW

LOW NOISE SEMICONDUCTOR DEVICE

CLAIM OF PRIORITY

The application claims priority from Japanese application JP2007-066900, filed on Mar. 15, 2007, the content of which is hereby incorporated by reference into this application.

BACKGROUND OF THE INVENTION

1. Field of the Invention

The present invention relates to a low noise semiconductor device, and more particularly to a high speed, low voltage semiconductor device, wherein power noise would pose a problem, in a semiconductor integrated circuit device for use in information processing apparatuses and the like.

2. Description of the Related Art

In recent years, power noise in semiconductor integrated circuit devices has come to pose an increasingly serious problem. This is attributable to (1) an increase in power noise quantity accompanying the rise in operating speed and the increase in power consumption, and (2) a decrease in power noise margin due to the use of lower voltage along with the evolution of the semiconductor process. Under these background circumstances, design techniques to keep power noise low enough and to secure stable operation of semiconductor circuits have become indispensable, and by one of such design techniques (Power Integrity design techniques; hereinafter referred to as PI design techniques or simply PI) the impedance of the power supply line is kept low over a broad bandwidth range. This method is made effective by the fact that the power noise voltage is determined by the product of the power supply current and the impedance of the power supply line.

Generally, electrically equivalent circuits to power feed routes are represented by serial and parallel circuits of resistance (R), inductance (L) and capacitance (C), and their impedance profile manifests a rugged pattern in which LC resonances and antiresonances on various power feed routes are in a row on the frequency axis.

In PI, it is desirable for the impedances of the power supply line to be uniformly low on the frequency axis as seen from within the chip (namely between A and A' in FIG. 3) so that electric charges can be smoothly exchanged with outside in the chip, but it is difficult to keep them uniformly low on account of the presence of resonances and antiresonances in the impedance profile as stated above. What poses a problem here is that the impedance is at its maximum at an antiresonance frequency, and a problem of particular significance with the impedance of the power supply line in the chip is posed by an antiresonance impedance arising from the inductance of the power supply line from the chip to a on-board decoupling capacitor and an on-chip capacitance. This is a phenomenon occurring in the medium frequency band from tens of MHz to 100 MHz, one example of which is a curve convex upward, such as what is encircled by a dotted line in FIG. 2, indicated as having "No applicable technique".

In a case of the related art, to suppress this antiresonance, the Q value is reduced by connecting a resistance to the power feed route to the decoupling capacitor in series (see JP-A-2006-032823(Patent Document 1)). By this technique, however, it is impossible to keep the impedance low for both low frequency and medium frequency because the impedance at low frequency is also raised by the insertion of the resistance in series. This impedance profile corresponds to "Uniform resistances in series inserted" in FIG. 2.

On the other hand, there are ways to realize low resistance at low frequency and high resistance at high frequency, namely a low Q state, while keeping impedance at low frequency low and suppressing antiresonance on the high frequency side by providing, around the power source-ground plane of the printed circuit board, a high resistance material or a high resistance structure (boring a hole or otherwise) or using a structure in which a high conductivity conductor with low conductivity conductors above and underneath as disclosed in JP-A-2001-244582 (Patent Document 2), JP-A-Hei-11-097810 (Patent Document 3) and U.S. Pat. No. 6,873,219 (Patent Document 4). Such techniques are effective in suppressing the antiresonance phenomenon that occurs on the power supply plane and work well against antiresonance phenomena of over 100 MHz.

SUMMARY OF THE INVENTION

However, in order to suppress the antiresonance impedance consisting of C of the on-chip capacitance and L of the power feed route of the decoupling capacitor which is regarded as posing the problem discussed here, the techniques described in Patent Documents 2 through 4 are inadequate in the following respect. Whereas the Q value of the line is determined by $Q=\omega L/R$, since L of the power feed route to the decoupling capacitor is greater than the nH order and L of the power supply plane, antiresonance damping by suppressing Q requires a higher resistance. More specifically, suppressing Q by tens of MHz requires hundreds of m$\Omega$. However, as the aforementioned method involves increasing the resistance of the power supply plane, which intrinsically is a low resistance part, this value cannot be attained unless the resistivity is raised to an extremely high level, and applying such a high resistivity material to the power supply plane is hardly realizable both in terms of cost and for reasons of manufacturing technology.

To address this problem, in order to accelerate the rise of resistance, structures which raise the resistance at the medium frequency, namely which lower the Q value of the feed line and reduce the antiresonance impedance at the medium frequency, are inserted into parts where the resistance is intrinsically high, namely where the aspect ratio is high (a long wiring part), on the power feed route from the chip to the decoupling capacitor. More specifically, such structures are inserted in the following two positions:

1. Semiconductor package power feed wiring part and power supply layer part, and
2. Decoupling capacitor package part.

The basic philosophy of the present invention can be described with respect to the equivalent circuit shown in FIG. 3. Thus, the route linking an LSI chip with the decoupling capacitor is divided into a route for the low frequency and a route for the medium frequency, and different electric parameters are given to the divided routes. More specifically, the route for low frequency is given high inductance and low resistance and that for medium frequency, low inductance and high resistance.

According to the invention, it is possible to obtain an impedance profile which is low in impedance in the low frequency band and low antiresonance impedance even in the medium frequency band. As a result, power noise can be kept low, which contributes to increasing the operating speed of semiconductor devices.

BRIEF DESCRIPTION OF THE DRAWINGS

FIGS. 6A and 6B illustrate power source-ground wiring within the semiconductor package of Embodiment 4, wherein FIG. 6A shows a top view and FIG. 6B shows a section;

FIGS. 8A and 8B show the configuration around the part where a decoupling capacitor of the semiconductor device of Embodiment 6 is interconnected, wherein FIG. 8A is a plan of a state in which the decoupling capacitor is mounted and FIG. 8B is a state in which the decoupling capacitor is not mounted;

FIGS. 12A and 12B show the configuration around the part where the decoupling capacitor of a semiconductor device of Embodiment 10 is interconnected, wherein FIG. 12A is a top view and is FIG. 12B, a section.

DETAILED DESCRIPTION OF THE PREFERRED EMBODIMENTS

Preferred embodiments of the present invention will be described in detail below with reference to the accompanying drawings. In all the drawings illustrating the embodiments, members having the same functions are as a rule denoted by respectively the same names, and their description will not be duplicated.

Embodiment 1

Figure 3:
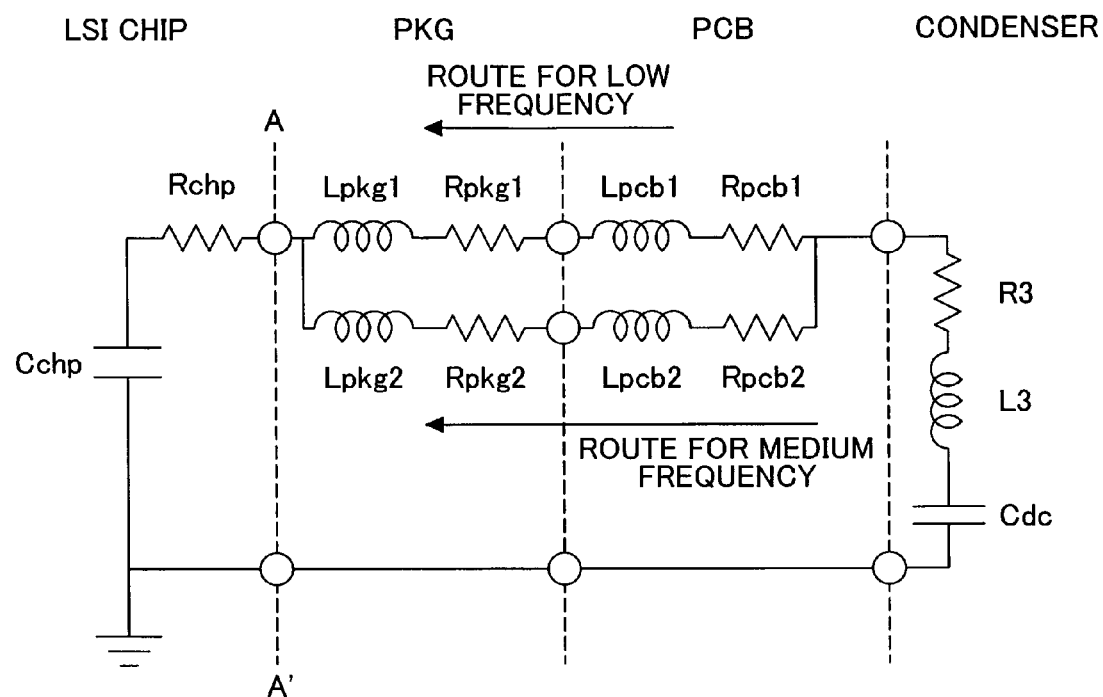
FIG. 3 is an equivalent circuit diagram illustrating the basic philosophy of the invention.

Embodiment 1 realizes the power feed line of the equivalent circuit shown in FIG. 3 with a semiconductor device including a printed circuit board mounted with multi-pin semiconductor packages and decoupling capacitors by using two kinds of wiring which differ in resistivity for power feed wiring in the semiconductor packages.

Figure 1A:
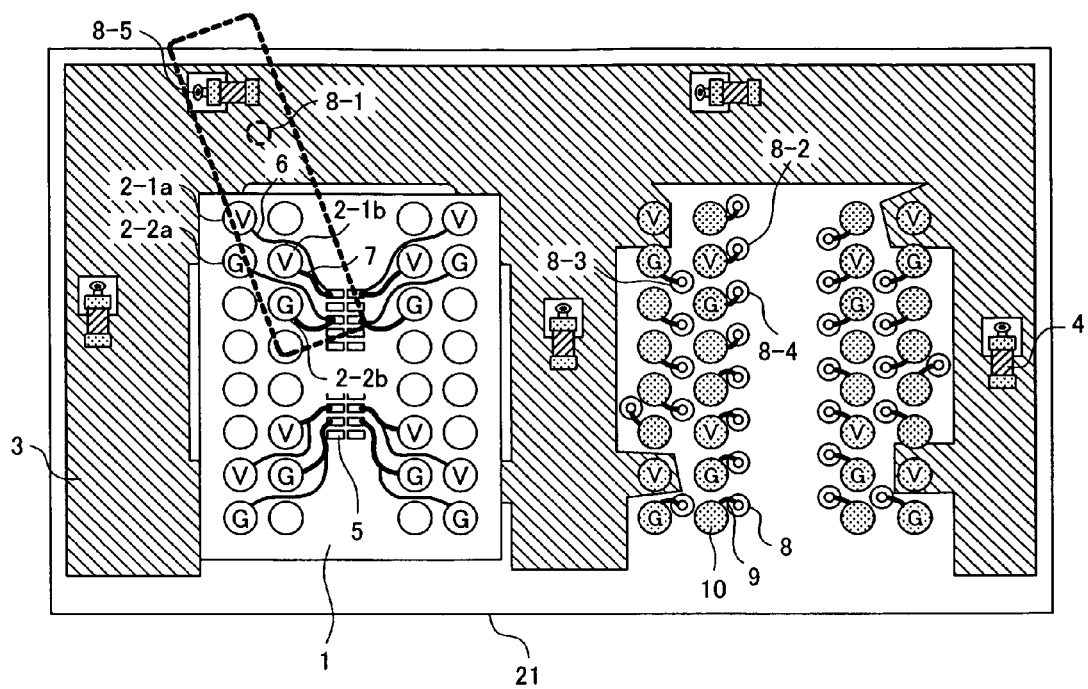
FIG. 1A shows a plan of a semiconductor device of Embodiment 1 of the present invention and FIG. 1B, a section of the internal wiring structure in the area surrounded by broken lines therein.

FIG. 1A shows a plan of the semiconductor device of Embodiment 1. A printed circuit board 21 of the semiconductor device is mounted with two semiconductor packages. The drawing shows a state in which the mounting position on the right side is not yet mounted with a semiconductor package. In the mounting positions, pads for balls 10 of a ball grid array (BGA) are arrayed. Most of the pads for balls are connected to a wiring layer within the substrate via wiring 9 and VIAs 8 penetrating the printed circuit board. Some of the pads for balls are connected to a power supply layer 3 on the surface of the substrate. Plural decoupling capacitors 4 are arranged surrounding the semiconductor package, and one electrode of each of them is connected to the power supply layer 3.

Figure 1B:
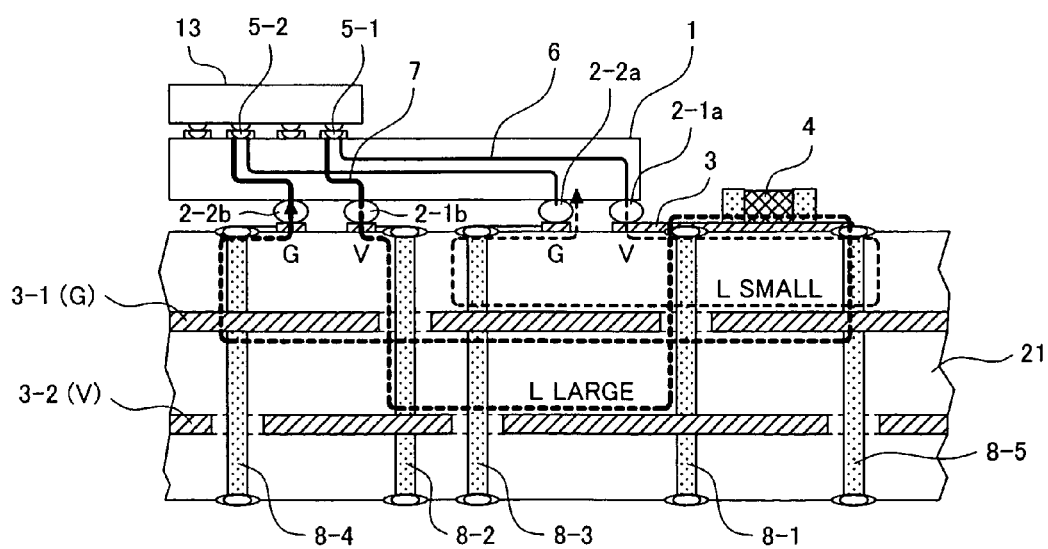

A semiconductor package 1 is mounted in the mounting position on the left side, and this semiconductor package 1 has the same structure as the semiconductor package to be mounted in the mounting position on the right side mentioned above. In the drawing, mainly the wiring structure of the substrate of the semiconductor package 1 is illustrated. FIG. 1B shows the sectional structure of the semiconductor device of Embodiment 1. It has to be noted that, to facilitate understanding of the structure, the wiring structure in the area surrounded by broken lines in FIG. 1A together with the whole of the power supply layer, ground wiring and ground layer is shown in the sectional view of FIG. 1B. Although it is the usual practice to provide the package substrate and the printed circuit board with signal wiring in addition to power wiring and ground wiring, illustration of signal wiring is dispensed with here. The semiconductor device of Embodiment 1 will be described in detail below mainly with reference to FIG. 1B.

A voltage from a power supply unit (not shown) is applied between an internal power supply layer 3-2 and a ground layer 3-1. Wiring 6 and wiring 7 are connected to an electrode 5-1 for connection to the power terminal of a semiconductor chip 13. The wiring 6, formed of a high resistance material such as Ni or NiP, is connected to an outside-positioned one (power supply pin 2-1a) out of the ball electrodes arrayed on the bottom face of the semiconductor package 1. The wiring 7, formed of a low resistance material such as Cu, is connected to an inside-positioned one (power supply pin 2-1b). Similarly, wiring of a high resistance material and wiring of a low resistance material are also connected to an electrode 5-2 for connection to the ground terminal of the semiconductor chip 13, and respectively connected to a ground pin 2-2a and a ground pin 2-2b, both ball electrodes on the bottom face of the semiconductor package. As routes from the decoupling capacitors 4 mounted on the printed circuit board to the power terminals of the semiconductor chip, there are a first route from the power supply layer 3 on the surface of the printed circuit board which passes a VIA 8-1, the internal power supply layer 3-2, a VIA 8-2, a power supply pin 2-1b and the low resistance wiring 7 and a second route which passes the power supply layer 3, a power supply pin 2-1a and the high resistance wiring 6. A return route close to the first route goes back to the decoupling capacitors 4 via the electrode 5-2 connecting to the ground terminal of the semiconductor chip 13, low resistance wiring, the ground pin 2-2b, a VIA 8-4, the ground layer 3-1 and a VIA 8-5. Another return route close to the second route enters the ground layer 3-1 via the electrode 5-2, the high resistance wiring, the ground pin 2-2a and a VIA 8-3 and goes back to the decoupling capacitors 4 via the VIA 8-5.

As this second route is directly connected to the power supply layer 3 to which the decoupling capacitors 4 are connected, its inductance is equal to only a small fraction of the inductance of the first route which runs via the internal power supply layer 3-2 having many VIA holes inside, the VIA 8-1 and the VIA 8-2. Thus, Embodiment 1 is characterized by the addition of the second route, which is lower in inductance and higher in resistance than the conventional first route to the route from the decoupling capacitors. This second route, which is lower in impedance than the first route in the region of and above tens of MHz, corresponds to the route for medium frequency shown on the equivalent circuit illustrated in FIG. 3. The presence of this second route enables the impedance profile of "This invention" shown in FIG. 2 to be obtained.

Embodiment 2

In Embodiment 2, a power feed line like the equivalent circuit shown in FIG. 3 is realized by using a high resistance material for the power source-ground wiring pairs within the semiconductor package. Its essential part is shown in FIG. 4.

Figure 2:
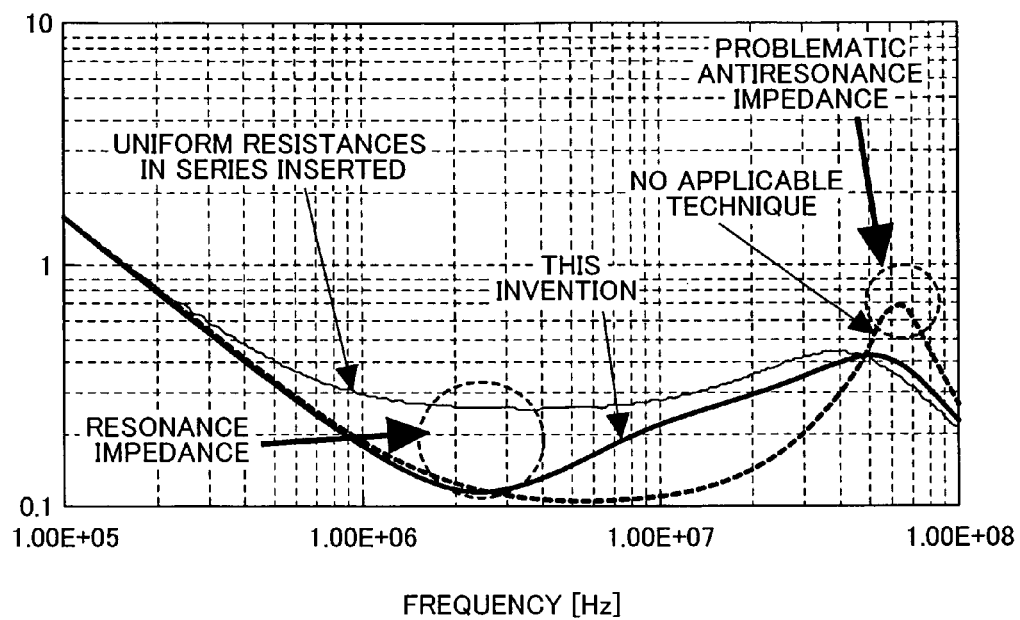
FIG. 2 shows power feed impedance profiles, one according to the related art and the other obtained by the invention.
Figure 4:
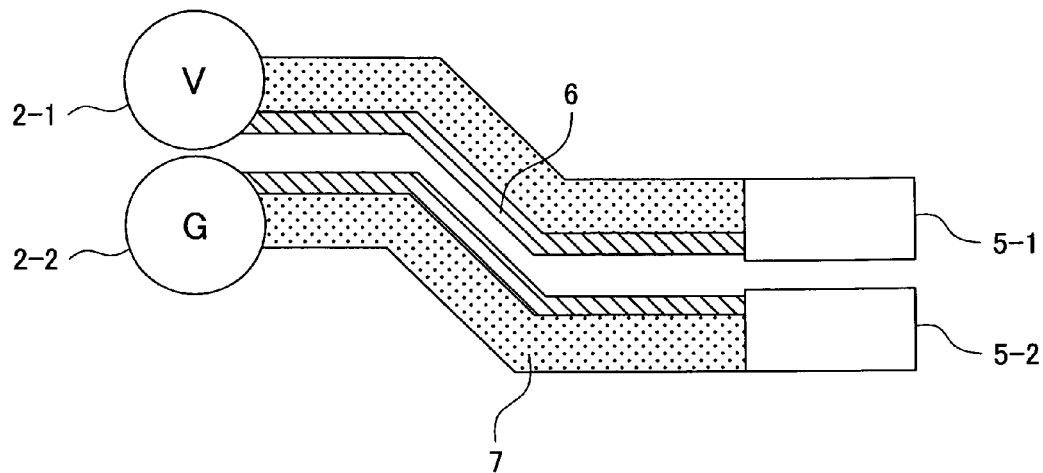
FIG. 4 is a plan of a power source-ground wiring pair within the semiconductor package of Embodiment 2.

The two wiring lines shown in FIG. 4 are only one pair of power wiring and ground wiring extracted out of the pairs of wiring in the package. A ball electrode 2-1 and a ball electrode 2-2, out of the BGA ball electrodes disposed at the bottom of the semiconductor package substrate constitute a pair, are used as a power supply pin and a ground pin, respectively. Power wiring which links a chip electrode 5-1 with the power supply pin 2-1 to which the power terminal of the semiconductor chip is connected is disposed in parallel and close to ground wiring linking the chip electrode 5-2 with the ground pin 2-2 to which the ground terminal of the semiconductor chip is connected. Inside parts 6 in which the paired wiring lines oppose each other are formed of a high resistance material. These parts will hereinafter be referred to as the high resistance parts 6. The remaining parts 7 of wiring are formed of a low resistance material. These parts will hereinafter be referred to as the low resistance parts 7. When a current is flowing through power source-ground wiring, if the frequency of the current increases, it tends to flow inside the paired wiring lines to minimize the effective inductance of the wiring part, because flowing in this way serves to increase the mutual inductance and reduce the effective inductance of the loop. Therefore, the higher the frequency, the higher becomes the resistivity, with the result that the impedance profile of "This invention" shown in FIG. 2 is obtained.

In order to achieve this effect sufficiently, it is preferable to use, for the high resistance parts 6, members whose resistivity is 10 times or more as high as the low resistance parts 7. More specifically, whereas Cu or Al is the usual material for the low resistance parts 7, a metallic material whose principal component is Mo, Pt, Au, Ir, Pb, Rh or Ag is suitable for the low resistance parts 7. For the high resistance parts 6, a material whose principal component is Ni, NiP, W, Cr or Sr, an organic compound or a metal oxide can be used. Since the skin thickness of copper is 7 to 20 μm and that of Ni is 10 to 30 μm at tens of MHz to 100 MHz, a wiring structure using copper of hundreds of μm in width for the low resistance parts 7 and Ni of 10 to 20 μm in width for the high resistance parts 6 would prove highly effective.

Embodiment 3

In Embodiment 3, a power feed line like the equivalent circuit shown in FIG. 3 is realized by using a high resistance material for the power source-ground wiring pairs within the semiconductor package and forming an alternately convex and concave shape, whereby the resistance in the medium frequency band is increased more efficiently than in Embodiment 2. Its essential part is shown in FIG. 5.

Figure 5:
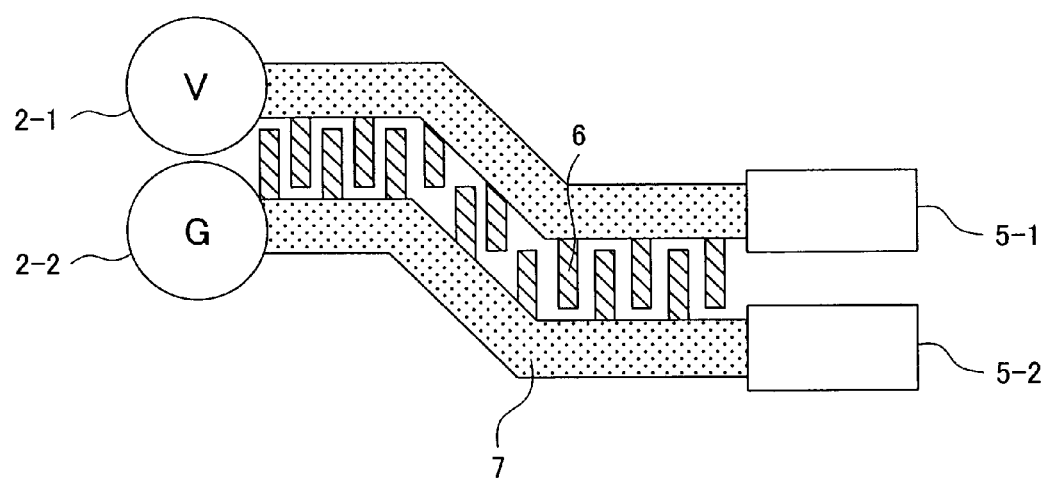
FIG. 5 is a plan of a power source-ground wiring pair within the semiconductor package of Embodiment 3.

FIG. 5 also shows the pair of power wiring linking the power supply pin 2-1 and the chip electrode 5-1 and ground wiring linking the ground pin 2-2 and the chip electrode 5-2 extracted out of the wiring in the semiconductor package of Embodiment 3. Trunk parts 7 of these paired wiring lines are formed of low resistance metal such as Cu. Protruding parts 6 formed of a high resistance material such as Ni extend from the inside where the trunk parts 7 oppose each other, and an insulator intervenes between the protruding parts where the protruding parts of the power wiring and the ground wiring alternate each other. When a current is flowing through power source-ground wiring, if the frequency of the current increases, it tends to flow inside the paired wiring lines to minimize the effective inductance of the wiring part, but, as power supply and ground lines resemble in shape in the alternate structure inside, the current tends to flow along the surfaces of the protruding parts. Therefore, when the frequency becomes higher, the effective resistivity also becomes higher, with the result that the impedance profile of "This invention" shown in FIG. 2 is obtained.

As an example of wiring structure where Ni is selected as the material for the protruding parts 6, a significant effect is achieved by setting the widths and thicknesses of the trunk parts 7 to hundreds of μm and tens of μm, respectively, the heights of the protruding parts 6 to 20 to 50 μm and the widths of the protruding parts 6 along the lengthwise direction of the wiring structure to 100 μm.

Embodiment 4

Figure 6A:
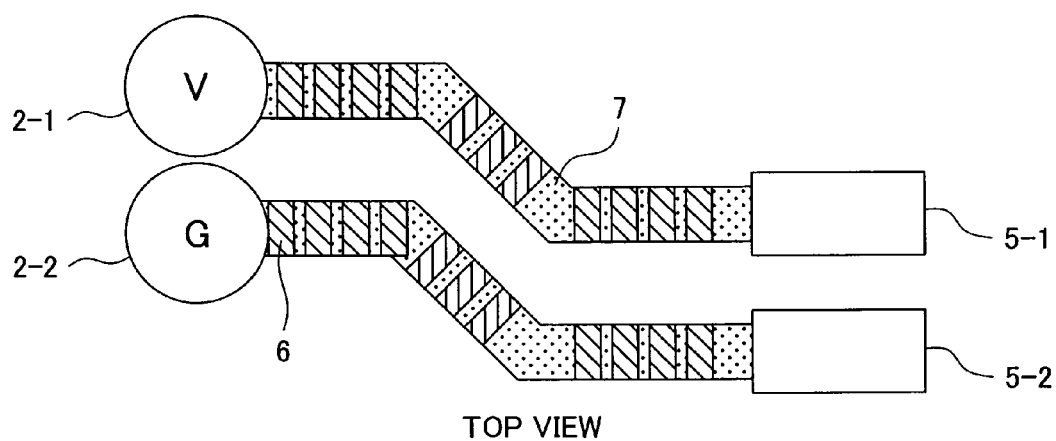
Figure 6B:
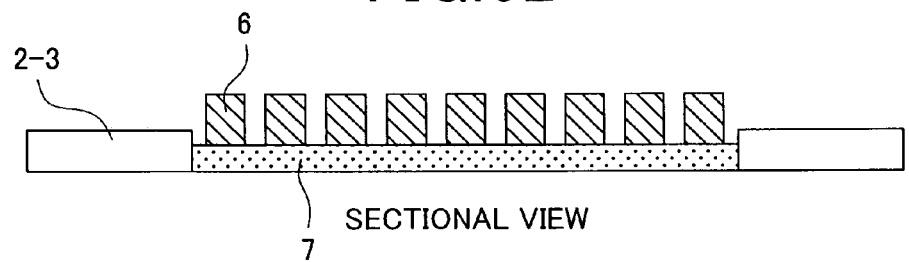

The principal part of Embodiment 4 is shown in FIGS. 6A and 6B. FIGS. 6A and 6B also show the pair of power wiring in the semiconductor package, and parts having counterparts in Embodiment 3 are assigned respectively the same reference signs as in FIG. 5. Embodiment 4 differs from Embodiment 3 in that the plural protruding parts 6 are fitted to the upper faces of power wiring and ground wiring, instead of inside where the power wiring and the ground wiring oppose each other. It is no different from Embodiment 3 in such respects that the trunk parts 7 of the wiring are formed of a low resistance material such as Cu and the protruding parts 6 are formed of a high resistance material such as Ni.

When a current is flowing through power source-ground wiring, if the frequency of the current increases, it tends to flow along the surfaces of, rather than inside, the wiring on account of the skin effect, because flowing in this way would cause the internal inductance, out of the internal inductance and the external inductance which are the constituent elements of the self-inductance, to be minimized and the overall self-inductance to be reduced accordingly. Therefore, the current flows along the surfaces of the protruding parts 6 formed of a high resistance material on the top surfaces of the trunk parts 7 of wiring formed of a low resistance material, and the mutually reinforcing effect of the elongation of the current route and the increase in resistivity enhances the effective resistivity in the medium frequency band, with the result that the impedance profile of "This invention" shown in FIG. 2 is obtained.

As an example of wiring structure where Ni is selected as the material for the protruding parts 6, a significant effect is achieved by setting the widths and thicknesses of the trunk parts 7 to hundreds of μm and tens of μm, respectively, the heights of the protruding parts 6 to 20 to 50 μm and the widths of the protruding parts 6 along the lengthwise direction of the wiring structure to 20 to 40 μm.

Embodiment 5

In Embodiment 5, a power feed line like the equivalent circuit shown in FIG. 3 is realized by using a high resistance material for the power source-ground wiring layer within the package substrate in a semiconductor package formed of a multilayered substrate.

Figure 7:
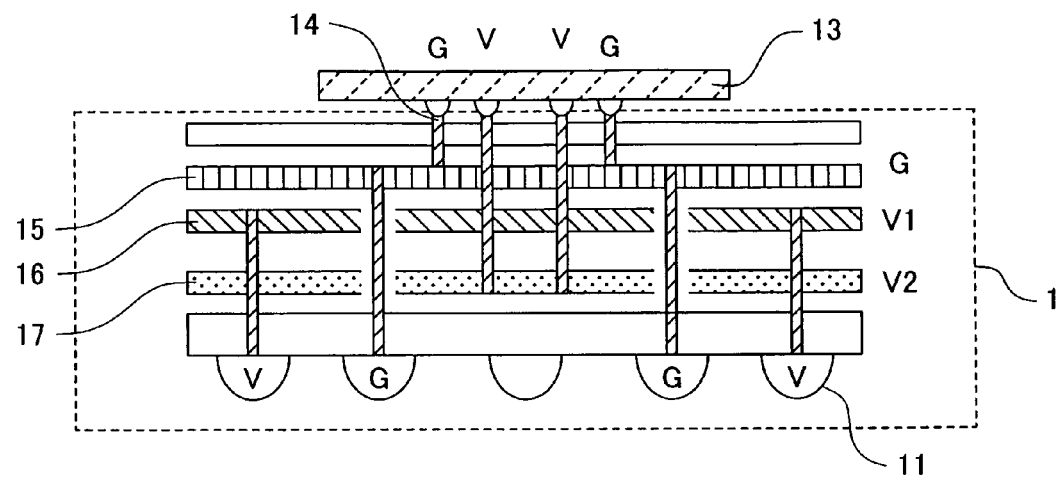
FIG. 7 shows a section of the internal wiring structure within the substrate of the semiconductor package of Embodiment 5.

Referring to FIG. 7, a package substrate 1 has inside it a ground layer 15, a power supply layer 16 formed of a high resistance material and a power supply layer 17 formed of a low resistance material in this order. The semiconductor chip 13 is interconnected over this package substrate 1 with bump electrodes 14. Connection to the ground terminals of the semiconductor chip denoted by G in the diagram is established through VIAs linked to the ground layer 15. On the other hand, connection to the power terminals of the semiconductor chip denoted by V in the diagram is established to VIAs which connect to both the power supply layer 16 and the power supply layer 17. At a low frequency, power supply is achieved by the flow of a current through the power supply layer 17 of a low resistance and the ground layer 15, but at a higher frequency the flow of the current concentrates on the power supply layer 16 adjoining the ground layer to minimize the inductance of the power supply layer because such a current flow increases the mutual inductance, which is determined by the correlated distance between the power supply layer and the ground layer, and the effective inductance of the loop accordingly decreases. Therefore, the higher frequency, the more the current is obliged to flow through the power supply layer of the high resistance material, with the result that the impedance profile of "This invention" shown in FIG. 2 is obtained.

Although the embodiment described here has a low resistance power supply layer and a high resistance power supply layer, applying a similar double-layered structure to the ground layer could also give the same effect.

Embodiment 6

The embodiments so far described are mainly characterized by their wiring structure within the semiconductor package. Unlike them, the embodiments to be described hereinafter are characterized by the interconnecting electrodes of their decoupling capacitors.

Figure 8A:
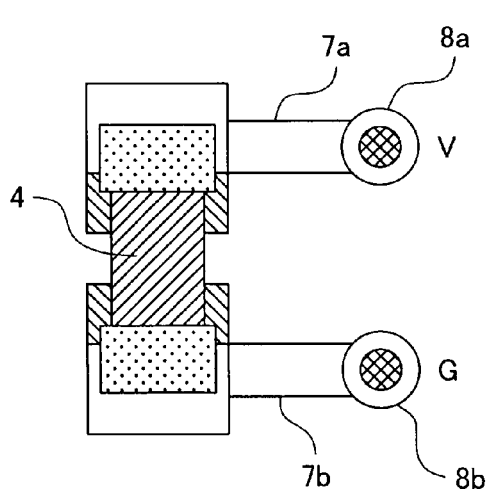
Figure 8B:
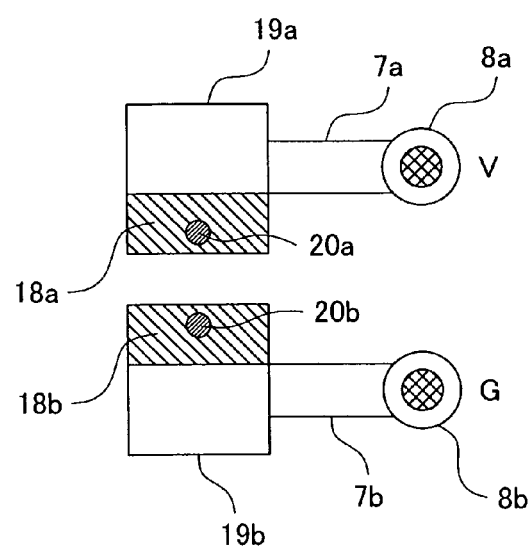

FIG. 8A is a plan of the configuration around the part where a decoupling capacitor of the semiconductor device of Embodiment 6 is interconnected. The decoupling capacitor 4 is mounted over the surface of a printed circuit board of the semiconductor package. FIG. 8B is a plan of the same part as in FIG. 8A in a state in which the decoupling capacitor is not yet interconnected. The power supply layer inside the printed circuit board (see the internal power supply layer 3-2 in FIG. 1B) is connected to the power supply pin of the semiconductor package. The ground layer inside the printed circuit board (see the ground layer 3-1 in FIG. 1B) is also connected to the ground pin of the semiconductor package. Wiring 7a is extended from a VIA electrode 8a on the surface of the printed circuit board which is connected to that power supply layer by way of a VIA, and its tip constitutes a capacitor interconnecting electrode. Similarly, wiring 7b is extended from a VIA electrode 8b which is connected to the ground layer by way of a VIA, and its tip constitutes another capacitor interconnecting electrode. The two ends of the decoupling capacitors 4 are connected to these two capacitor interconnecting electrodes. Inside areas 18a and 18b of these capacitor interconnecting electrodes which are close to each other are formed of a high resistance material. Directly underneath the high resistance area 18a, there is a VIA 20a connecting to the power supply layer. Similarly, directly underneath the high resistance area 18b, there is a VIA 20b connecting to the ground layer. Thus, the VIAs 20a and 20b are pad-on VIAs. This structures causes a second route passing the high resistance area 18a and the VIA 20a to be formed between the decoupling capacitors 4 and circuits within the semiconductor chip in addition to a first route passing a low resistance area 19a, the wiring 7a and the VIA electrode 8a. This results in the realization of the power feed line of the equivalent circuit shown in FIG. 3.

Thus, while the current flows mainly by way of the first route at a low frequency, as the frequency of the current rises, it comes to flow by way of the second route via the pad-on VIAs which are lower in inductance. As a result, the resistance of the line is increased by using a high resistance material around the pad-on VIA, enabling the impedance profile of "This invention" shown in FIG. 2 to be obtained.

In this case, the effect is scarce unless the resistivity of the high resistance areas 18a and 18b is greater by one digit or more than that of the low resistance area. Therefore, a material whose resistivity is only about a few times as greater as that of Cu, such as Ni, is insufficient for this embodiment, for which a material whose resistivity is greater by two or three digits, such as NiP, is effective.

Embodiment 7

In Embodiment 7, as in Embodiment 6, a power feed line like the equivalent circuit shown in FIG. 3 is realized by a structural contrivance used in the vicinities of the interconnecting parts of the decoupling capacitors.

Figure 9:
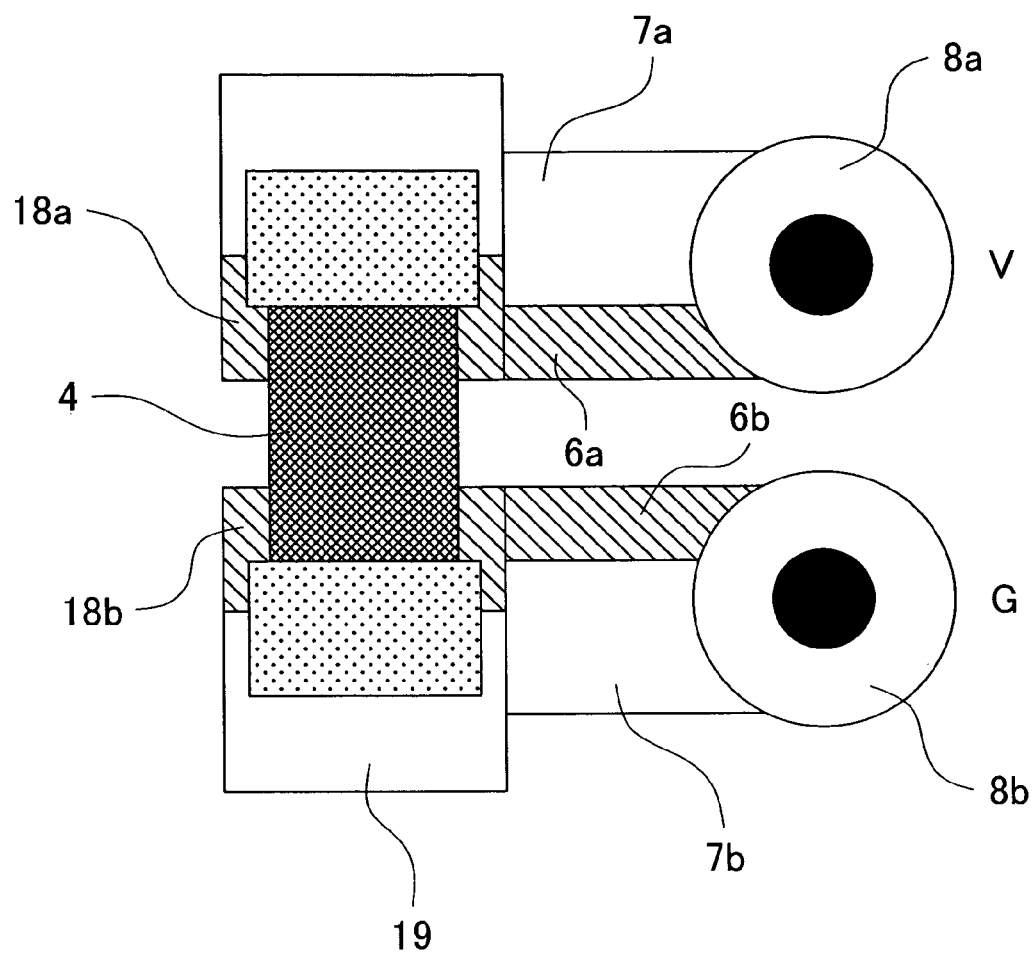
FIG. 9 is a plan showing the configuration around the part where a decoupling capacitor of the semiconductor device of Embodiment 7 is interconnected.

FIG. 9 is a plan showing the configuration around the part where a decoupling capacitor of the semiconductor device of Embodiment 7 is interconnected. The inside areas 18a and 18b of the capacitor interconnecting electrodes for interconnecting the decoupling capacitors 4 are high resistance areas like their counterparts in the embodiment shown in FIG. 8. In addition, high resistance areas 6a and 6b are also disposed in the opposing inside parts of the wiring lines 7a and 7b extended from the VIA electrodes 8a and 8b. In this embodiment, there are no VIAs directly underneath the high resistance parts 18a and 18b of the pad. This embodiment is an application of the structure described with reference to Embodiment 2 to the interconnecting electrodes for decoupling capacitors, and is similar to Embodiment 2 in action and effect.

Embodiment 8

Embodiment 8, which is a modified version of Embodiment 7, realizes a power feed line like the equivalent circuit shown in FIG. 3 as does Embodiment 6 or 7.

Figure 10:
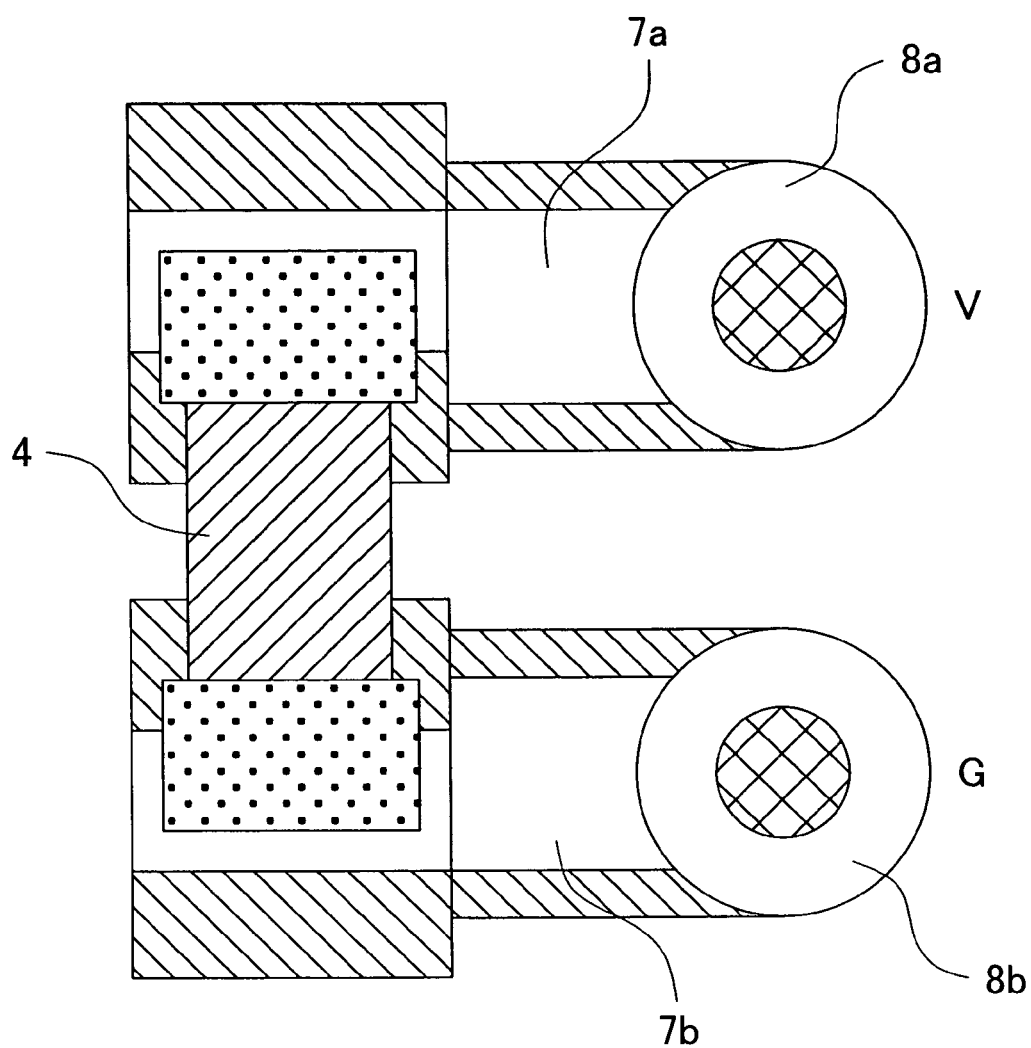
FIG. 10 is a plan showing the configuration around the part where the decoupling capacitor of a semiconductor device of Embodiment 8 is interconnected.

FIG. 10 is a plan showing the configuration around the part where the decoupling capacitor of a semiconductor device of Embodiment 8 is interconnected. High resistance parts (marked with oblique lines) are added not only in inside areas where the wiring lines 7a and 7b extended from the VIA electrodes 8a and 8b and the capacitor interconnecting electrodes oppose each other but also in outside areas.

Where power wiring and ground wiring are close to each other, the current distribution at a high frequency mainly concentrates on the inside surface where power wiring and ground wiring oppose each other. Therefore, the structure of Embodiment 7 gives a greater effect. On the other hand, where power wiring and ground wiring are away from each other by reason of the use of large size chip capacitors or the like, the current distribution at a high frequency mainly concentrates on the two sides of each wiring line, and accordingly the structure of FIG. 10 is more effective.

Embodiment 9

Figure 11:
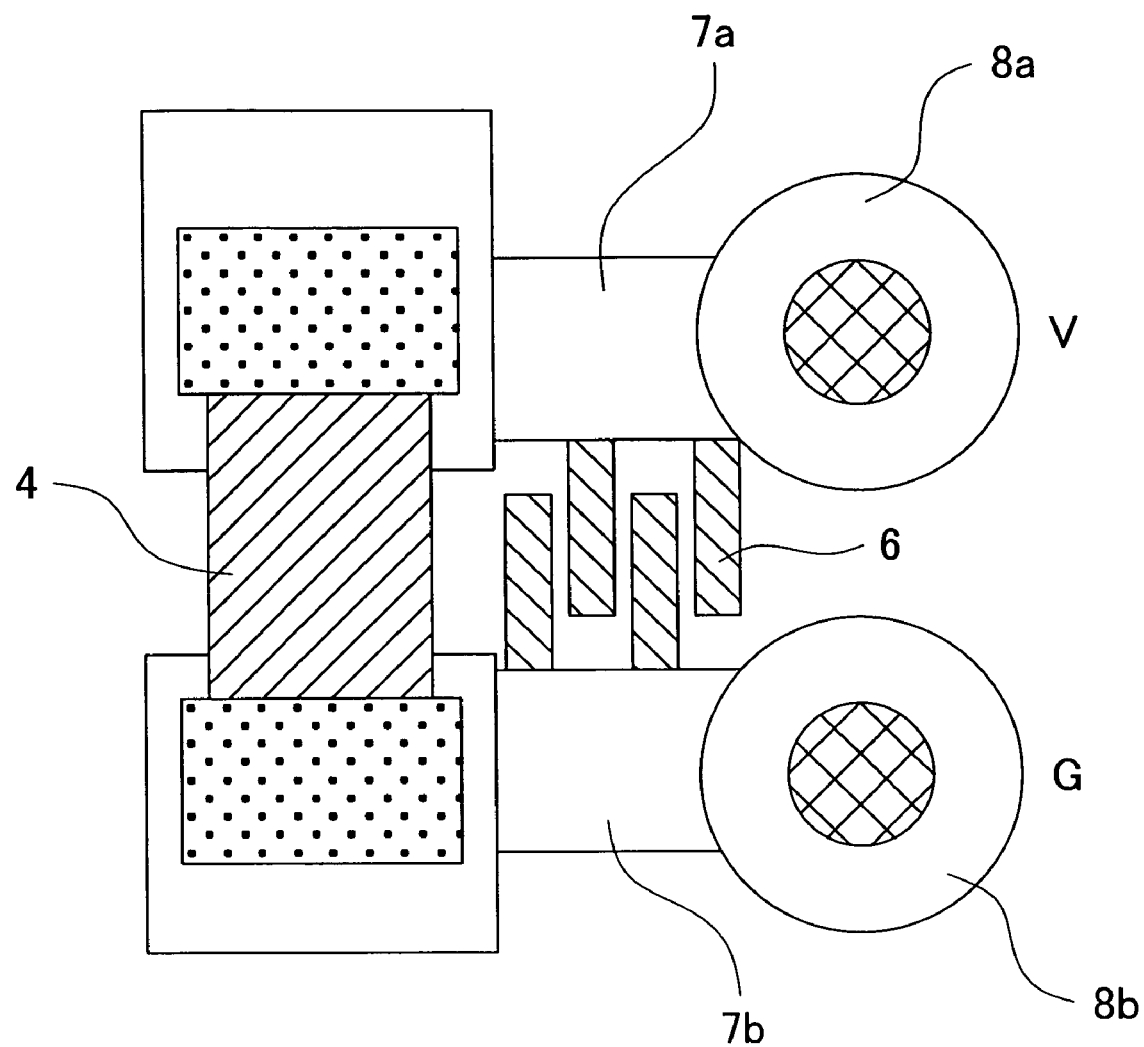
FIG. 11 is a plan showing the configuration around the part where the decoupling capacitor of a semiconductor device of Embodiment 9 is interconnected.

In Embodiment 9, which is another modified version of Embodiment 7, protruding parts of an alternate structure similar to that described with reference to Embodiment 3 are used for wiring in the vicinities of the interconnecting parts of the decoupling capacitors. The following description will refer to FIG. 11. The wiring lines 7a and 7b respectively extend from the VIA electrodes 8a and 8b toward the capacitor interconnecting electrodes for interconnecting the decoupling capacitor 4. Branched protruding parts 6 are disposed inside where the wiring lines oppose each other, and are close to each other in an alternate arrangement. The material and size suitable for the protruding parts are similar to those described with respect to Embodiment 3, and the action and effect of this embodiment are also similar to those of Embodiment 3.

Embodiment 10

Figure 12A:
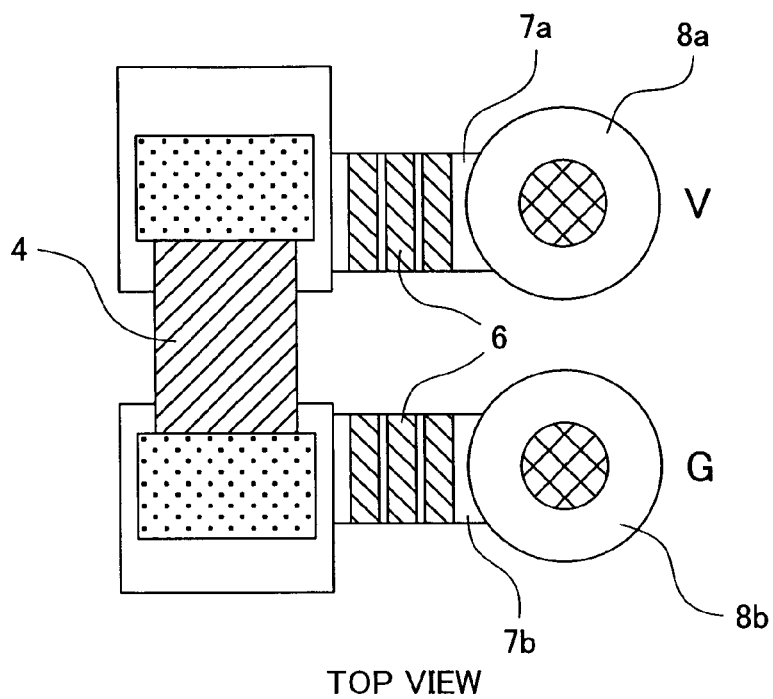
Figure 12B:
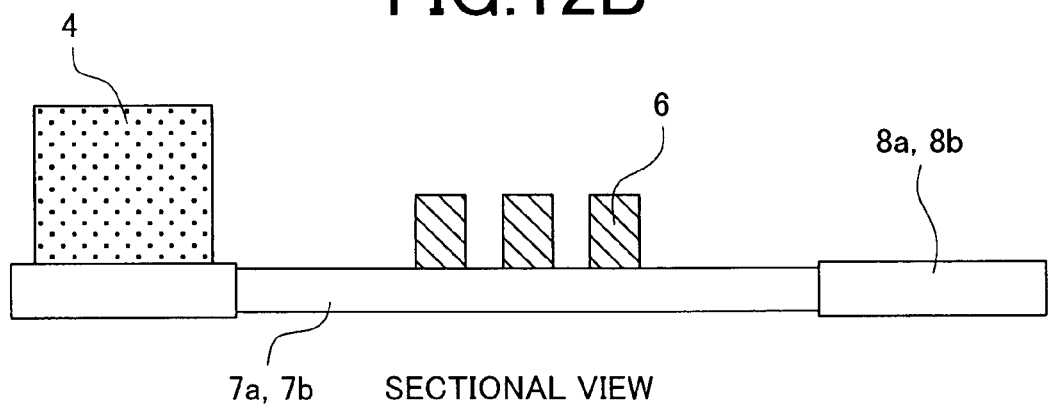

In Embodiment 10, which is still another modified version of Embodiment 7, protruding parts similar to those described with respect to Embodiment 4 are used for wiring in the vicinities of the interconnecting parts of the decoupling capacitors. FIG. 12A is a top view of these parts and, FIG. 12B is a section of the same. The protruding parts 6 formed of a high resistance material are arrayed on the top faces of the wiring lines 7a and 7b which respectively extend from the VIA electrodes 8a and 8b toward the capacitor interconnecting electrodes for interconnecting the decoupling capacitor 4. The material and size suitable for the protruding parts are similar to those described with respect to Embodiment 4, and the action and effect of this embodiment are also similar to those of Embodiment 4.

What is claimed is:

1. A semiconductor device comprising:
a semiconductor chip having at least a power terminal and a ground terminal;
a semiconductor package having a first terminal and a second terminal and being electrically connected to the power terminal and the ground terminal, respectively;
a third terminal, a fourth terminal, a fifth terminal and a sixth terminal being connected to a printed circuit board;
a plurality of first power feed routes being connected between the first terminal and the third terminal, and between the first terminal and the fourth terminal, respectively; and
a plurality of second power feed routes being connected between the second terminal and the fifth terminal, and between the second terminal and the sixth terminal, respectively,
wherein the semiconductor package is provided on the printed circuit board and a power supply layer for electrical connection to the power terminal and a ground layer for electrical connection to the ground terminal are disposed in at least one of inside layers of the printed circuit board and a decoupling capacitor is mounted on the surface of the printed circuit board,
wherein further on a surface of the printed circuit board provided with a plurality of first VIA electrodes connected with the power supply layer by way of VIA, a plurality of second VIA electrodes connected with the ground layer by way of VIA, a first interconnection connected with the first VIA electrode, a second interconnection connected with the second VIA electrode, a first capacitor interconnecting electrode connecting to the first interconnection and mounting on an opposite side of the printed circuit board with respect to the first VIA electrode, a second capacitor interconnecting electrode connecting to the second interconnection, and mounting on an opposite side of the printed circuit board with respect to the second VIA electrode, and
the decoupling capacitor being connected to the first capacitor interconnecting electrode and the second capacitor interconnecting electrode, respectively, and
wherein the first capacitor interconnecting electrode and the second capacitor interconnecting electrode provide a high resistance area comprised of a high resistance material and a low resistance area comprised of a low resistance material,
the high resistance area of the first capacitor interconnecting electrode and the high resistance area of the second capacitor interconnecting electrode are disposed on inner sides of the first interconnection and the second interconnection, respectively so as to be disposed face to face on the surface of the printed circuit board,
the low resistance area of the first capacitor interconnecting electrode and the low resistance area of the second capacitor interconnecting electrode are disposed on an outer side of the first interconnection and the second interconnection.

2. The semiconductor device according to claim 1, wherein in a plurality of first power feed routes, a first conductive body in the power feed routes for connection between the first terminal and the third terminal has a first resistivity, and
a second conductive body in the power feed routes for connection between the first terminal and the fourth terminal has a second resistivity higher than the first resistivity.

3. The semiconductor device according to claim 1, wherein a pad-on VIA for electrical connection to the power supply layer is placed directly below the high resistance area of the first capacitor interconnecting electrode, and
a pad-on VIA for electrical connection to the ground layer is placed directly below the high resistance area of the second capacitor interconnecting electrode with respect to the printed circuit board, respectively.

4. The semiconductor device according to claim 3, wherein a third interconnection passing through one of the plurality of first power feed routes and a fourth interconnection passing through one of the plurality of second power feed routes are provided, and
a protruding part is alternately formed of the third interconnection and the fourth interconnection between the third and fourth interconnection and the resistance of the protruding part is higher than that of the third and fourth interconnection.

* * * * *